US008271914B2

(12) United States Patent
Maturana et al.

(10) Patent No.: US 8,271,914 B2
(45) Date of Patent: *Sep. 18, 2012

(54) METHOD AND APPARATUS FOR SIMULATING BEHAVIORAL CONSTRUCTS USING INDETERMINATE VALUES

(75) Inventors: Guillermo Maturana, Berkeley, CA (US); Arturo Salz, Menlo Park, CA (US); Joseph T. Buck, Campbell, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/043,791

(22) Filed: Mar. 9, 2011

(65) Prior Publication Data

US 2011/0161897 A1    Jun. 30, 2011

Related U.S. Application Data

(63) Continuation of application No. 12/109,589, filed on Apr. 25, 2008, now Pat. No. 7,934,183.

(51) Int. Cl.
*G06F 17/50* (2006.01)
(52) U.S. Cl. ......... 716/101; 716/103; 716/106; 716/107
(58) Field of Classification Search .................. 716/101, 716/103, 106, 107
See application file for complete search history.

(56) References Cited

U.S. PATENT DOCUMENTS

| 6,975,976 | B1 | 12/2005 | Casavant |
|---|---|---|---|
| 7,093,216 | B2 | 8/2006 | Nozuyama |
| 7,292,970 | B1 | 11/2007 | Hurlock |
| 7,464,015 | B2 | 12/2008 | Iwashita |
| 2002/0038203 | A1 | 3/2002 | Tsuchiya |
| 2006/0155521 | A1 | 7/2006 | Iwashita |

OTHER PUBLICATIONS

Bening, Lionel "A Two-State Methodology for RTL Logic Simulation", DAC 99, New Orleans, Proceedings of the 36th ACM/IEEE Conference on Design Automation.
Turpin, Mike "The Dangers of Living with an X (bugs hidden in your Verilog)", Version 1.1 (Oct. 14, 2003) pp. 1-34, XP-002533090.
Howe, Helen "Pre and Postsynthesis Simulation Mismatches", Cadence Design Systems, Inc. IEEE 1997, pp. 24-31.
Haufe, Christian et al., "Ad-Hoc Transactions to Close Verilog Semantics Gap", 2008 IEEE.

*Primary Examiner* — Sun Lin
(74) *Attorney, Agent, or Firm* — Park, Vaughan, Fleming & Dowler LLP; Laxman Sahasrabuddhe

(57) ABSTRACT

One embodiment of the present invention provides a system that simulates behavioral constructs of a register transfer level design using indeterminate values. The system may receive hardware description language code which includes a construct that behaves differently depending on the value of an expression, e.g., the construct may execute different portions of code based on the value of a control expression, or it may store data in different storage locations based on the value of an index expression, etc. In response to determining that the expression's value is indeterminate, the system can execute two or more alternatives that are controlled by the expression, and then merge the results in some prescribed way. An embodiment of the present invention can enable a user to reduce the discrepancy between the results generated by a register transfer level simulation and the results generated by the associated gate level simulation.

24 Claims, 6 Drawing Sheets

METHOD AND APPARATUS FOR SIMULATING BEHAVIORAL CONSTRUCTS USING INDETERMINATE VALUES

RELATED APPLICATION

This application is a continuation of, and hereby claims priority under 35 U.S.C. §120 to, U.S. patent application Ser. No. 12/109,589 (now issued U.S. Pat. No. 7,934,183), entitled "Method and Apparatus for Simulating Behavioral Constructs Using Indeterminate Values," by the same inventors as the instant application, filed on 25 Apr. 2008, the contents of which are herein incorporated by reference.

BACKGROUND

1. Field of the Invention

The present invention relates to electronic design automation. More specifically, the present invention relates to methods and apparatuses for simulating behavioral constructs using indeterminate values.

2. Related Art

Rapid advances in computing technology have been made possible by sophisticated simulation and verification. Indeed, without such tools it would be almost impossible to verify complicated integrated circuits which are commonly found in today's computing devices.

In the early stages of an electronic design flow, a design is usually described at a high level of abstraction, and in later stages the design is described at progressively lower levels of abstraction. Simulations that are performed at a higher level of abstraction usually execute faster than simulations that are performed at lower levels of abstraction, because each event or operation at the higher level of abstraction maps to multiple events or operations at the lower level of abstraction. However, simulations at the lower level of abstraction are usually more accurate than the simulations at the higher level of abstraction because the simulations at the lower level of abstraction are more detailed than the simulations at the higher level of abstraction.

To reduce design time, it is usually desirable to accurately identify errors as early as possible in the design flow. If an error is identified at a later stage, it can substantially increase the design time because a number of stages in the design flow will most likely have to be repeated for the debugged design. Hence, it is usually desirable to ensure that the simulations at different levels of abstraction are consistent with one another, because otherwise an error may only be found at a later stage when a simulation at a lower level of abstraction is performed on the design.

SUMMARY

One embodiment of the present invention provides a system that simulates behavioral constructs of an RTL (register transfer level) design using indeterminate values. Specifically, an embodiment of the present invention can enable a user to reduce the discrepancy between the results generated by an RTL simulation and the results generated by the associated gate level simulation.

During operation, the system may receive HDL (hardware description language) code which includes a construct that behaves differently depending on the value of an expression, e.g., the construct may execute different portions of code based on the value of a control expression, or it may store data in different storage locations based on the value of an index expression, etc. In response to determining that the expression's value is indeterminate, the system can execute two or more alternatives that are controlled by the expression, and then merge the results in some prescribed way.

Specifically, an embodiment of the present invention modifies the HDL semantics for indeterminate values, e.g., the semantics of an "if" statement when the condition is indeterminate, the semantics of a case statement when the condition or a case expression is indeterminate, the semantics of edge-sensitive events controlling a process when a term in the sensitivity list becomes indeterminate, the semantics of an indexed selection of a part of a variable when the index is indeterminate, the semantics of ternary operators when the control expression is indeterminate, the semantics of conversions from 4-state to 2-state values, the semantics of edge-sensitive events within a process when a term in the sensitivity list becomes indeterminate, the semantics of level-sensitive event control when the condition is indeterminate, etc.

Embodiments of the present invention can simulate behavioral constructs using a number of approaches. For example, the system may modify or rewrite the HDL code (e.g., using a pre-compiler) so that the modified HDL code behaves according to the new HDL semantics. Alternatively, an HDL compiler may be modified so that it generates object code according to the new semantics. In yet another approach, an HDL interpreter may be modified so that it interprets the HDL code according to the new semantics.

DETAILED DESCRIPTION

Integrated Circuit (IC) Design Flow

Figure 1:
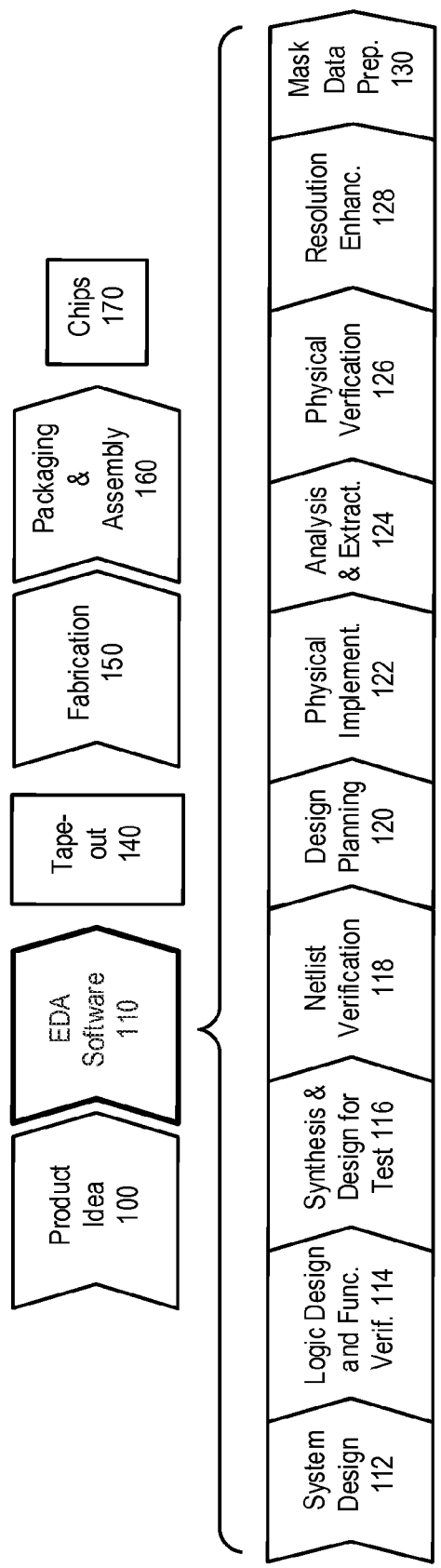
FIG. 1 illustrates various stages in the design and fabrication of an integrated circuit in accordance with an embodiment of the present invention.

FIG. 1 illustrates various stages in the design and fabrication of an integrated circuit in accordance with an embodiment of the present invention.

The process usually starts with a product idea (step 100) which is realized using an EDA process (step 110). Once the design is finalized, it is usually taped-out (event 140) and goes through the fabrication process (step 150) and packaging and assembly processes (step 160) to produce the finished chips (result 170).

The EDA process (step 110) comprises steps 112-130, which are described below for illustrative purposes only and are not meant to limit the present invention. For example, an actual integrated circuit design may require the designer to perform the design steps in a different sequence than the sequence described below.

System design (step 112): In this step, the designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber®, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS®, Vera®, DesignWare®, Magellan™, Formality®, ESP and Leda® products.

Synthesis and design for test (step 116): The VHDL/Verilog can be translated to a netlist in this stage. The netlist can be optimized for the target technology, and tests can be designed and implemented to check the finished chips. Exemplary EDA software products from Synopsys, Inc. that can be used at this step include Design Compiler®, Physical Compiler®, Test Compiler, Power Compiler™, FPGA Compiler, TetraMAX®, and DesignWare® products.

Netlist verification (step 118): In this step, the netlist is checked for compliance with timing constraints and for correspondence with the VHDL/Verilog source code. Exemplary EDA software products from Synopsys, Inc. that can be used at this step include Formality®, PrimeTime®, and VCS® products.

Design planning (step 120): Here, an overall floorplan for the chip is constructed and analyzed for timing and top-level routing. Exemplary EDA software products from Synopsys, Inc. that can be used at this step include Astro™ and IC Compiler products.

Physical implementation (step 122): The placement (positioning of circuit elements) and routing (connection of the same) occurs at this step. Exemplary EDA software products from Synopsys, Inc. that can be used at this step include the Astro™ and IC Compiler products.

Analysis and extraction (step 124): At this stage, the circuit function is verified at a transistor level; this in turn permits what-if refinement. Exemplary EDA software products from Synopsys, Inc. that can be used at this step include AstroRail™, PrimeRail, PrimeTime®, and Star-RCXT™ products.

Physical verification (step 126): In this step, the design is checked to ensure correctness for manufacturing, electrical issues, lithographic issues, and circuitry. Exemplary EDA software products from Synopsys, Inc. that can be used at this step include the Hercules™ product.

Resolution enhancement (step 128): This step involves geometric manipulations of the layout to improve manufacturability of the design. Exemplary EDA software products from Synopsys, Inc. that can be used at this step include Proteus/Progen, ProteusAF, and PSMGen products.

Mask data preparation (step 130): This step provides the "tape-out" data for production of masks to produce finished chips. Exemplary EDA software products from Synopsys, Inc. that can be used at this step include the CATS® family of products.

Embodiments of the present invention can be used during one or more of the above-described steps. Specifically, one embodiment of the present invention can be used during the logic design and functional verification step 114.

Simulation and Verification

Figure 2:
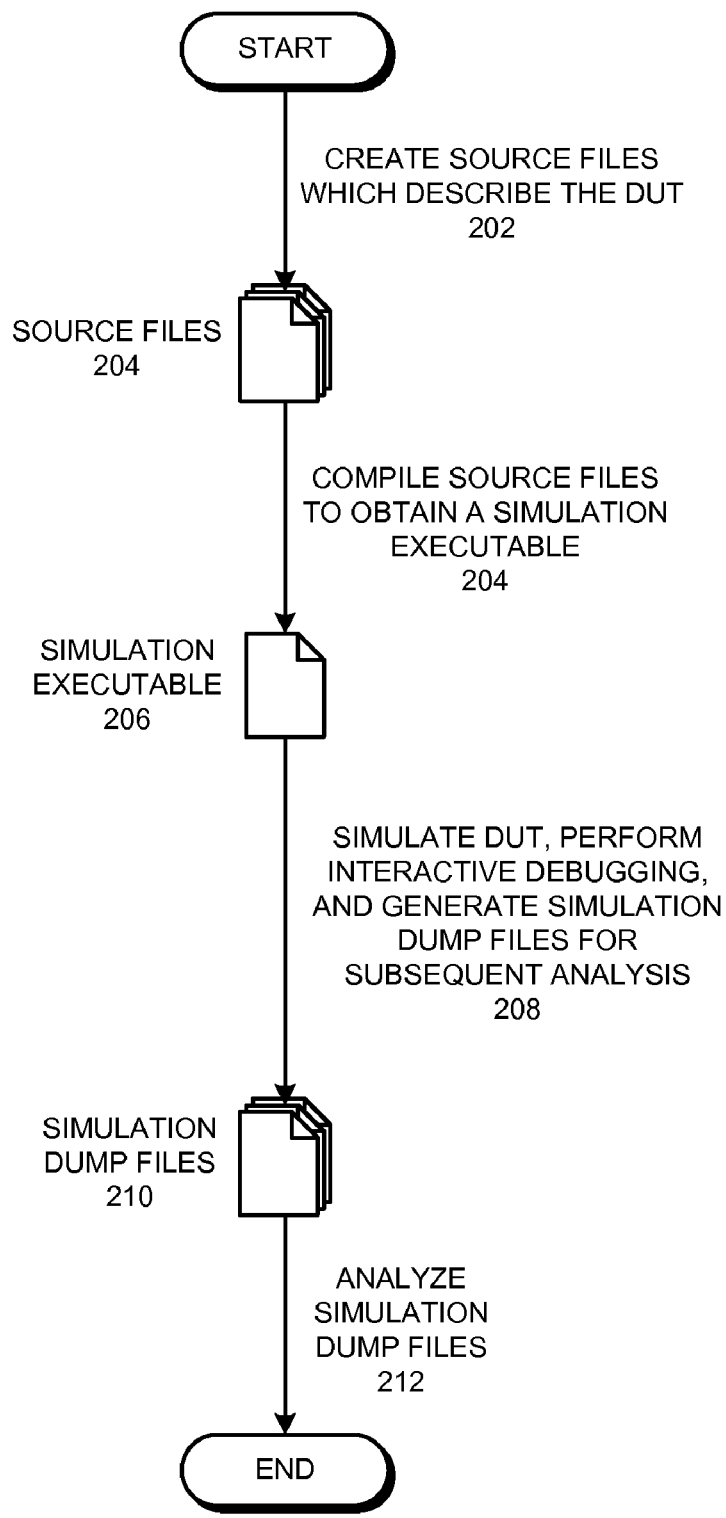
FIG. 2 illustrates a workflow for a simulation and verification solution in accordance with an embodiment of the present invention.

FIG. 2 illustrates a workflow for a simulation and verification solution in accordance with an embodiment of the present invention.

The process typically begins by creating source files 204 that describe the design under test (DUT) (step 202). Source files 204 may describe the DUT using an HDL. For example, the DUT can be described using a standardized HDL, such as Verilog.

Next, a compiler can be used to compile the source files to obtain a simulation executable 206 (step 204). Simulation executable 206 can be a software application which when executed simulates the behavior of the DUT. The simulation executable can also include instructions to perform verification of the DUT during simulation. For example, the compiler can be configured so that it generates instructions for checking the functionality of different parts of the DUT during simulation.

The simulation executable can then be executed to simulate the DUT, perform interactive debugging, and simulation dump files 210 may be generated for subsequent analysis (step 208). Simulation dump files 210 typically contain information about how signal values changed during simulation. Next, the simulation dump files may be analyzed (step 212) to debug the DUT.

The workflow shown in FIG. 2 is for illustrative purposes only and is not intended to limit the scope of the present invention. A number of variations will be apparent to practitioners skilled in the art. For example, the system can use a pre-compiler to modify the source files, and then compile the modified source files. Alternatively, the system can use interpretive simulators which typically do not need a compilation step in their workflow. Note that compiler-based approaches usually simulate faster and use less memory than interpreter-based approaches because a compiler-based approach avoids the extra layers and inefficiency of an interpreter-based approach. The time required to compile source files can be reduced substantially by using incremental compilation which reuses compiled modules unless the associated source files were updated since the last compilation.

RTL Simulation and Gate Level Simulation

A DUT can be simulated at different levels of abstraction. For example, HDLs typically describe a design at the register transfer level (RTL). At this level, the DUT's behavior is defined in terms of registers which store signal values, and combinational logic which performs logical operations on signal values. On the other hand, a DUT can also be described at a gate level which is a lower level of abstraction than the register transfer level. At the gate level, a DUT is represented as a network of logic gates.

A simulation at a higher level of abstraction usually executes faster than a simulation at a lower level of abstraction because each event or operation at the higher level of abstraction typically maps to multiple events or operations at the lower level of abstraction. However, simulation at the lower level of abstraction is typically more accurate than the simulation at the higher level of abstraction, because the simulation at the lower level of abstraction is more detailed than the simulation at the higher level of abstraction. Hence, the simulation at the higher level of abstraction may miss errors that show up only when the simulation is performed at the lower level of abstraction.

The early stages of a design flow usually describe a design at a high level of abstraction, and subsequent stages describe the design at progressively lower levels of abstraction. For example, an RTL design can be synthesized to generate a gate level design.

To reduce design time, it is desirable to accurately identify errors as early as possible in the design flow. If an error is identified at a later stage, it can substantially increase the design time because a number of stages in the design flow will most likely have to be repeated for the debugged design. Hence, it is desirable to ensure that the simulations at different levels of abstraction identify the same set of errors. Specifically, an RTL simulation should generate the same set of errors as a gate level simulation. Otherwise, an RTL design that seems error-free may contain errors that are discovered only when a gate level simulation is performed.

Note that it may be very challenging to ensure that an RTL simulation will identify exactly the same errors as a gate level simulation. However, it is desirable to reduce the discrepancy between the two simulations.

Indeterminate Values and Power-Up Modeling

HDLs typically enable a user to indicate that a signal's value is indeterminate. An indeterminate value can be interpreted as a "don't care" value during logic optimization. For example, HDL code can assign a special value to a variable which indicates that the variable's value is indeterminate. During synthesis, the system can exploit variables with indeterminate values to determine an optimized logic circuit that uses the least number of gates.

For example, in Verilog, the symbol "X" can be used to indicate an unknown bit in a variable, which can be used to indicate that a variable's value belongs to a set of values. The value "1'bX" indicates a one bit unknown value which can be either "1'b0" or "1'b1." The value "2'b1X" indicates a two bit value whose most significant bit is equal to "1," and whose least significant bit has an unknown value. Hence, the value "2'b1X" can either be "2'b10" or "2'b11." Similarly, the value "2'bXX" can be one of four possible values, namely, "2'b00," "2'b01," "2'b10," "2'b11." A variable has an "indeterminate" value if the variable's value can be two or more values.

Modeling the behavior of a circuit during power-up poses a very important verification problem, since the signal values during power-up are usually indeterminate. Further, accurately modeling power-up behavior can be especially important for complex low-power circuits, because these circuits typically operate at low voltages; hence, a small difference in a signal's voltage can change whether the signal is interpreted as a "0" or a "1," which increases the amount of uncertainty in the power-up signal values. Further, since these circuits are complex, it increases the possibility of having explicit or implicit assumptions about power-up signal values, which in turn, increases the possibility that the power-up signal values will violate these assumptions, thereby causing illegal behavior.

As noted earlier, it is desirable to detect design errors as early as possible in the design flow. In particular, it is desirable to detect illegal behaviors during power-up in an RTL design. Power-up behavior can be modeled in an RTL design using the HDL's special value, e.g., the "X" symbol in Verilog, which when assigned to a variable, indicates that the variable's value is indeterminate.

Unfortunately, conventional HDL compilers and simulators do not properly interpret an indeterminate value for certain HDL constructs. This may be because the indeterminate value was primarily intended to help a compiler to optimize a logic circuit, and was not intended to be used for simulating behavior of an RTL design using indeterminate signal values. Hence, in conventional techniques, users cannot employ such HDL constructs if they want to correctly model power-up behavior. Note that it may be possible to write HDL code that explicitly handles situations when the variable is indeterminate. However, such an approach would be cumbersome since it would require the user to write code in an unnatural way. Further, rewriting existing HDL code so that it explicitly handles indeterminate values can be impractical due to the enormous costs associated with such an endeavor. In contrast to conventional techniques, one embodiment of the present invention provides a system which interprets indeterminate values in a way that enables accurate modeling of power-up behavior without requiring a user to rewrite existing HDL code.

Figure 3:
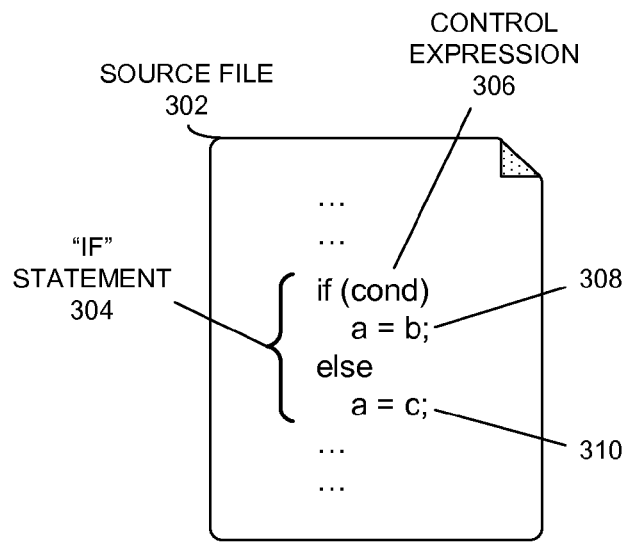
FIG. 3 illustrates an "if" construct in accordance with an embodiment of the present invention.

FIG. 3 illustrates an "if" construct in accordance with an embodiment of the present invention.

Source file 302 can contain HDL code which includes "if" statement 304. "If" statement 304 uses control expression 306 to determine whether to execute statement 308 or statement 310. For example, suppose that control expression 306 evaluates to a one bit value. If the value of control expression 306 is equal to "1'b1," statement 308 will be executed. On the other hand, if the value of control expression 306 is equal to "1'b0," statement 310 will be executed. However, we are interested in the behavior when control expression 306's value is indeterminate, i.e., when control expression 306's value is equal to "1'bX." Unfortunately, in this scenario, conventional Verilog semantics treat the "1'bX" value as a "1'b0" value. In other words, if control expression 306 is equal to "1'bX," statement 310 will be executed under conventional Verilog semantics. Clearly, if control expression 306 is assigned an indeterminate value for modeling power-up behavior, conventional Verilog semantics would fail to model the behavior accurately, because the conventional simulator would execute "if" statement 304 as if control expression 306's value was equal to "1'b0."

Figure 4:
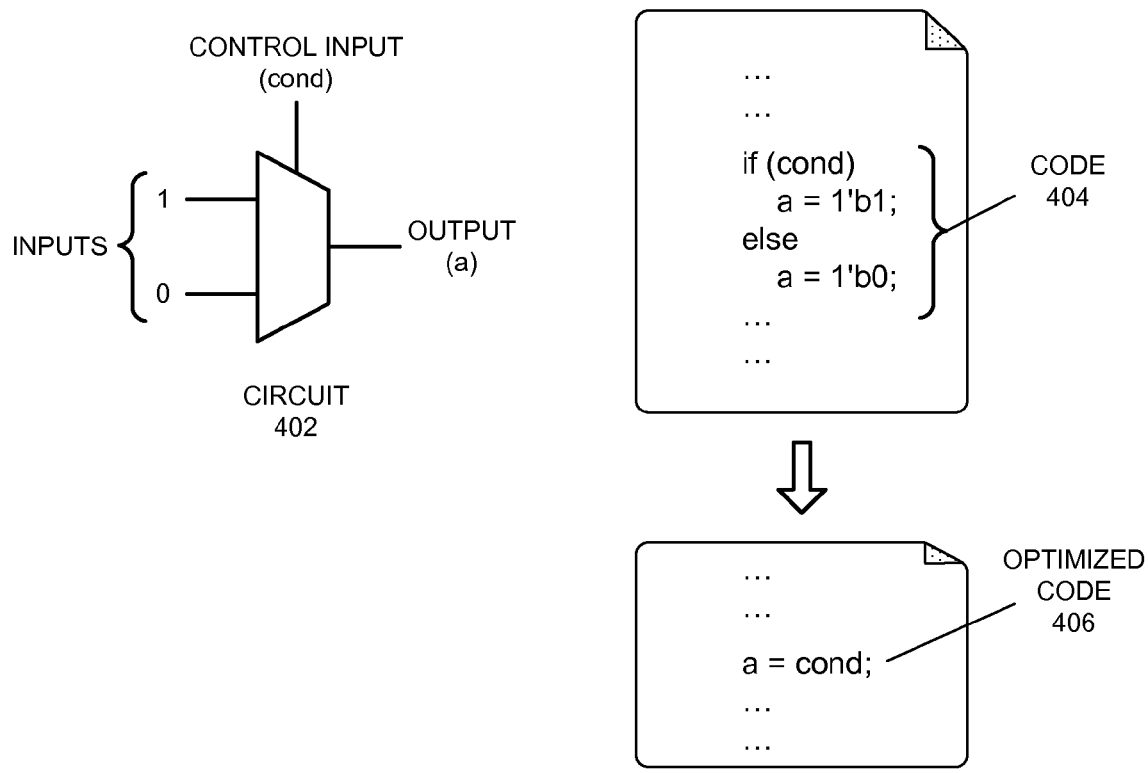
FIG. 4 illustrates how an RTL simulation can be inconsistent with a gate level simulation in accordance with an embodiment of the present invention.

FIG. 4 illustrates how an RTL simulation can be inconsistent with a gate level simulation in accordance with an embodiment of the present invention.

Circuit 402 is a selector which includes: two inputs which have values "1" and "0," a control input, and an output. When the control input is equal to 1, the input with the "1" value is coupled with the output, and when the control input is equal to 0, the input with the "0" value is coupled with the output. Circuit 402 can be represented using HDL code 404. Specifically, HDL code 404 represents the selector's control input with variable "cond," and the selector's output with the variable "a." When HDL code 404 is synthesized to generate a gate level design, HDL code 404 may be optimized so that at the gate level, the equivalent HDL code would look like optimized code 406. Note that the compiler may not actually generate optimized code 406; instead, it may synthesize HDL code 404 as a latch which is equivalent to the optimized code 406.

It will be apparent to one skilled in the art that code 404 and optimized code 406 are functionally equivalent. However, since conventional techniques do not interpret indeterminate values properly, the RTL simulation and the gate level simulation may generate different results under conventional Verilog semantics. Specifically, suppose the "cond" variable is indeterminate, e.g., suppose the "cond" variable is equal to "1'bX." Since Verilog treats an "X" value as a "0" value during simulation, a conventional RTL simulation will assign value "0" to the output variable "a." On the other hand, a gate level simulation will assign the value "X" to the output variable "a." Hence, in this scenario, the RTL simulation can be inconsistent with the gate level simulation, which is undesirable.

This discrepancy between the RTL simulator and the gate level simulator can cause false positives or false negatives when the RTL simulator's error report is compared with the gate level simulator's error report. For example, a false positive may occur when the RTL simulator reports an error which is actually not an error according to the gate level simulator. Similarly, a false negative may occur when the RTL simulator does not report an error which the gate level simulator reports. One embodiment of the present invention enables a user to reduce the discrepancy between the results generated by an RTL simulator and the results generated by a gate level simulator. Specifically, an embodiment of the present invention can enable a user to reduce the occurrence of false positives and false negatives by changing the HDL semantics.

The following sections describe systems and techniques that can be used to simulate HDL code so that the simulator properly handles indeterminate values.

Simulating Behavioral Constructs Using Indeterminate Values

In one embodiment, the system receives HDL code which includes a construct that behaves differently depending on the value of an expression, e.g., the construct may execute different portions of code based on the value of a control expression, or it may store data in different memory locations based on the value of an index expression, etc. In response to determining that the expression's value is indeterminate, the system executes all alternatives controlled by the expression, and then merges the results in some prescribed way.

One way to collapse the results is to ensure that any state that is different among the alternatives also becomes indeterminate. Note that the merging process seems easier to comprehend if the alternatives don't involve conditional scheduling operations. If some alternatives schedule future events, the merging process can become difficult.

One embodiment creates renamed variables when assignments occur in different portions (or blocks) of code that are controlled by an indeterminate condition. Next, the embodiment can merge the values of all renamed variables and perform an assignment to the original variable.

Since the merging process typically operates on the renamed variables, the order in which the renamed variables are merged is usually irrelevant. For example, suppose the original variables are a, b, and c. Further, suppose that variable a is associated with renamed variables $a_1$ and $a_2$, variable b is associated with renamed variables $b_1$ and $b_2$, and variable c is associated with renamed variables $c_1$ and $c_2$. The merging process can first merge renamed variables $a_1$ and $a_2$ to obtain variable a's value. Next, the merging process can obtain values for variables b and c by merging the associated renamed variables. However, the merging process could also have merged the renamed variables in a different order, e.g., first merge $c_1$ and $c_2$, then $b_1$ and $b_2$, and finally $a_1$ and $a_2$. However, note that in some situations, the order can matter. In such situations, the system can ensure that the renamed variables are merged in the proper order.

The merging process can be performed in a number of ways. For example, one technique would be to output an indeterminate value if the arguments to the merge operation are not equal to one another, and to output the value of one of the arguments if the arguments are equal to one another. For example, if $a_1$ and $a_2$ are not equal to one another, the merge operation may output an indeterminate value. On the other hand, if $a_1$ and $a_2$ are equal to one another, the merge operation may output the value of $a_1$. Another technique would be to output an indeterminate value if the control expression is indeterminate. Hence, in this technique, the merge operation will always output an indeterminate value regardless of whether the arguments are equal to one another or not. In one embodiment, the system can optimize the HDL code so that the system assigns indeterminate values to output variables without executing the different alternatives in response to determining that the control expression's value is indeterminate.

An embodiment of the present invention enables a user to select the type of merge that the user wants to use. Hence, the embodiment may enable a user to specify that the first merge technique be used at one place in the HDL code, and that the second merge technique be used at another place in the HDL code.

An embodiment of the present invention modifies the HDL semantics for indeterminate values, e.g., the semantics of an "if" statement when the condition is indeterminate, the semantics of a case statement when the condition or a case expression is indeterminate, the semantics of edge-sensitive events controlling a process when a term in the sensitivity list becomes indeterminate, the semantics of an indexed selection of a part of a variable when the index is indeterminate, the semantics of ternary operators when the control expression is indeterminate, the semantics of conversions from 4-state to 2-state values, the semantics of edge-sensitive events within a process when a term in the sensitivity list becomes indeterminate, the semantics of level-sensitive event control when the condition is indeterminate, etc.

The HDL semantics can be modified using a number of techniques. For example, the system may modify or rewrite the HDL code (e.g., using a pre-compiler) so that the modified HDL code behaves according to the new HDL semantics. One benefit of this technique is that it may not require changes to the HDL compiler since the new semantics are implemented in the pre-compiler. Alternatively, an HDL compiler may be modified so that it generates object code according to the new semantics. In yet another approach, an HDL interpreter may be modified so that it interprets the HDL code according to the new semantics.

Modifying Semantics for HDL Constructs

The following sections provide examples of how embodiments of the present invention can modify the semantics of HDL constructs.

"If" Statement

For an "if" statement with an indeterminate condition, actions of both alternatives can be performed, and then the values of all variables that were assigned in either one can be merged.

For example, consider the following "if" statement:

```
if (cond)
    a = b;
else
    a = c;
```

An embodiment of the present invention can modify HDL semantics by interpreting this "if" statement as if it were written as follows:

```
if (|cond === 1'bx)
    a1 = b;
    a2 = c;
    a = merge(a1, a2);
else
if (cond)
    a = b;
else
    a = c;
```

The expression (|cond===1'bx) performs an "OR" operation using the bits of the "cond" variable and determines if the result of the "OR" operation is indeterminate. If even one of the bits in the "cond" variable is equal to "1," the result of the "OR" operation will be "1'b1." However, if the "cond" variable has one or more "X" bits, and all other bits are "0," then the result of the "OR" operation will be "1'bX." If the embodiment determines that the result of the "OR" operation is indeterminate, the embodiment uses renamed variables a1 and a2 to model the execution of the two branches of the "if" statement, merges the resulting values of a1 and a2 using the "merge" function, and assigns the merged value to the variable a. On the other hand, if the embodiment determines that the result of the "OR" operation is not indeterminate, the embodiment executes the original "if" statement according to the usual HDL semantics.

Note that there may be a number of ways of rewriting the original "if" statement. For example, the original "if" statement can be rewritten as follows.

a=(|cond==='x) ? merge(b, c): (cond ? b: c);

Alternatively, the original "if" statement can be rewritten as follows.

```
if (cond)
    a = b;
else if (!cond)
    a = c;
else begin
    a1 = b;
    a2 = c;
    a = merge(a1, a2);
end
```

The "merge" function can enable a user to control how the "if" statement is interpreted when the conditional is indeterminate. Specifically, the user can change the interpretation of the "if" statement at compile time or at runtime. For example, the user may specify that a "pessimistic" merge function should be used which returns an indeterminate value regardless of the argument values. In the above example, a "pessimistic" merge function would return an indeterminate value even if b is equal to c.

Alternatively, the user may use a more "optimistic" merge function which tries to determine a known value whenever possible. For example, an "optimistic" merge function may return an argument value if the arguments are equal to one another, and return an indeterminate value if the arguments are not equal to one another.

Another example of an "optimistic" merge function is a function that performs a bit-wise comparison of the arguments and returns a value whose bits are indeterminate only if the respective bits in the arguments are not equal to one another. For example, suppose variable b is equal to "2'b10," and variable c is equal to "2'b11." An optimistic merge function may merge these values to obtain the value "2'b1X." These examples of merge functions have been presented for illustrative purposes and are not intended to limit the invention to the forms disclosed. It will be apparent to one skilled in the art that a number of other merge functions can be used.

The "else" block may be missing in an "if" statement as shown below:

```
if (cond)
    a = b;
```

In the above "if" statement, the variable a does not change if the variable cond is equal to "0." Hence, the "if" statement can be rewritten as follows:

```
if (|cond === 1'bx)
    a1 = b;
    a2 = a;
    a = merge(a1, a2);
else
if (cond)
    a = b;
```

There can be a number of other ways to rewrite the above "if" statement. For example, the above "if" statement can also be rewritten as follows:

a=(|cond==='x) ? merge (b, a): (cond ? b: a);

It will be readily apparent to one skilled in the art that the above technique for rewriting "if" statements can be adapted for other situations. For example, a chain of "else if" statements can be unwound in a bottom-up fashion starting from the last "if." If we rewrite the last "if" statement in the manner described above, we will be left with an "if" statement that has one less "else." In this manner, the whole "if" statement can be rewritten by repeatedly rewriting the individual "if" statements.

Similarly, if there are multiple assignments within an "if" statement, they can also be handled by using the above-described techniques. Specifically, a set of renamed variables can be created for each original variable that was assigned in either alternative, and then the sets of renamed variables can be merged to determine the values of the original variables.

The "if" statements may also modify variable values within functions or tasks as well. In such scenarios, the set of variables that are modified in the different alternatives can be extracted, and the modified code can assign values to the renamed variables instead of the original variables, and finally the system can perform all necessary merge operations.

Note that even if the "if" statement had already been written in a way that properly deals with indeterminate values, it can still be rewritten or interpreted using the new semantics as described above. For example, consider the following "if" statement which uses an "else if" construct:

```
if (|cond === 1'bx)
    a = 'x;
else
if (cond)
    a = b;
else
    a = c;
```

A rewrite of the bottom "if" construct would be useless, because the condition will never be indeterminate. Indeterminate conditions would be caught by the top "if" statement. Hence, rewriting the bottom "if" statement will preserve the original behavior. In other words, if the "if" statement has already been written in a way that properly deals with indeterminate values, rewriting the "if" statement will do no harm, i.e., it will preserve the intended behavior.

An HDL may support directives that can be used to modify the semantics for an "if" statement. For example, an HDL may include the "unique" and the "priority" directive which generate an error if none of the conditions in a nested "if" statement succeeds and if there is no "else" block to handle such situations. The "unique" directive may also generate an error if multiple conditions in a nested "if" statement are true. For these error-generating scenarios, all output variables can be set to "X" during simulation. Similarly, for the "parallel" and the "full" directive, the output variables can be set to "X" when the simulation encounters scenarios in which these directives would generate errors.

For example, the HDL semantics can be modified so that the system adds an additional "else" statement at the end of an "if" statement that has a "unique," "priority," or "full" directive. The "else" statement catches situations which would have generated an error, and assigns "X" values to the output variables. For "if" statements that include the "unique" and "parallel" directives, the system can assign an "X" value to the output variables if there are multiple matches among the nested "if" statements, i.e., if the conditions are not mutually exclusive.

"Case" Statement

According to the conventional semantics of a "case" statement, a block in the case statement is selected only if the label associated with the block matches the control variable or expression. Hence, if the control variable or expression includes indeterminate bits, the "case" statement may select the default block if one exists, or it may not select any block at all.

One embodiment of the present invention modifies the semantics of a "case" statement when the control variable or expression includes one or more indeterminate bits. Specifically, the embodiment can execute the blocks that are associated with the case labels that may match the control variable or expression. The embodiment can then merge the results of executing the different blocks. For example, if the control expression's value is "2'b1X," the embodiment may execute blocks that are associated with labels "2'b10" and "2'b11" and merge the results.

The behavior of a case statement is equivalent to a nested "if" statement. For example, consider the following case statement:

```
case (a)
  l0: s0;
  l1: s1;
  l2: s2;
endcase
```

The above case statement is essentially equivalent to the "if" statement shown below:

```
if (a === l0) s0;
else if (a === l1) s1;
else if (a === l2) s2;
```

The equivalent "if" statement shown above can be interpreted according to the new semantics for "if" statements. Note that the conventional semantics of a case statement use the case comparison operator ("==="). An embodiment of the present invention can change the semantics of the case statement by using the regular comparison operator ("==") instead of the case comparison operator.

If there is any explicit "X" or "Z" bit in either a label or the case condition, the semantics can remain unchanged. Also, one embodiment of the present invention does not treat the default condition in the "case" statement in a special way, i.e., the default condition can also be considered to be an alternative of the case statement if the case condition is indeterminate.

"Casex" and "casez" statements can be treated consistently with the regular "case" statement. For example, they can be transformed into a regular "case" statement by expanding any "X" or "Z" bits in a literal label according to the specific type of the "case" statement. Note that the expansion of the "X" and "Z" bits will be to a two-state value. For example, an "X" or a "Z" bit in a "casex" statement can be expanded to a "0" and a "1." In a "casez" statement, a "Z" bit can be expanded to a "0" and a "1," but an "X" bit may not be expanded. Once a "casex" or a "casez" statement has been transformed into a regular "case" statement, it can then be interpreted according to the new case semantics as explained above.

SystemVerilog allows "unique" and "priority" directives to be used with "case" statements. Synthesis also allows "full" and "parallel" directives to be used with a "case" statement. These directives can be handled the same way they were handled for "if" statements. Specifically, if there is a missing match the embodiment can add a default label which assigns an "X" value to all assigned variables. Similarly, if there is a multiple match case (a unique or parallel violation), an "X" value can be assigned to the relevant variables.

"Case" statements that specify the behavior for indeterminate values in the case expression will be treated the same way as normal "case" statements that do not specify the behavior for indeterminate values. In other words, "case" statements that have already been written to handle indeterminate values may not need to be treated differently than those that have not been written to handle indeterminate values. However, interpreting such "case" statements according to the new semantics may override the behavior that the user intended.

Process Sensitivity

A process's sensitivity list determines whether the process is triggered or not. If the sensitivity list includes indeterminate values, the question is whether the process will be triggered or not. One embodiment of the present invention merges the results from the two scenarios, namely, the scenario in which the process is triggered, and the scenario in which the process is not triggered. For example, the embodiment can merge the new values that the process assigns to the variables when the process is triggered and the pre-existing values which correspond to the scenario when the process is not triggered.

The indeterminate values in the sensitivity list could be edge operators on signals, or plain signals which correspond to edge and level-sensitive terms in the processes. For edge operators, an indeterminate value can occur when the edge transitions into an indeterminate value or transitions out of an indeterminate value. Embodiments of the present invention deal with both types of indeterminate transitions because the values sampled by the logic can be different for the two types of transitions, leading to different output assignments.

For ease of explanation, we will use an "edge" operator to represent a transition between two values. Specifically, we will use the "edge" operator to illustrate how embodiments of the present invention can handle indeterminate transitions by changing the HDL semantics for transitions. For example, "edge([01]) clk" represents a rising edge on clock "clk." Likewise, the Verilog semantics of "posedge" is equivalent to "edge([01][0X][0Z][X1][Z1])," i.e., a positive edge includes transitions from 0 to 1, 0 to X, 0 to Z, X to 1, or Z to 1.

In Verilog, a D flip-flop with input "d," output "q," and clock "clk," can be modeled as follows:

always @ (posedge clk) q<=d;

An embodiment of the present invention uses the following semantics for the D flip-flop:

```
always @(edge([01]) clk) q <= d;
always @(edge([0x][0z][x1][z1]) clk) q <= merge(d, q);
```

In other words, for the D flip-flop, a transition from 0 to 1 is handled as before, but a transition from 0 to X, 0 to Z, X to 1, or Z to 1 will result in merging the value of "d" with "q," and assigning the merged value to "q."

Variable Index Expressions

A variable index expression is one that selects a portion of a vector or array based on a selector variable or expression. If the selector variable or expression is indeterminate, the portion of the vector or array that is being selected is indeterminate. Under conventional HDL semantics, when a read operation is performed on an array whose index is indeterminate, the read operation returns an indeterminate value. One embodiment of the present invention does not change the semantics of a read operation on a vector or array when the index has an indeterminate value. In other words, the embodiment returns an indeterminate value if a read operation is performed on a vector or an array using an index value which is indeterminate. Another embodiment of the present invention can modify the conventional HDL semantics by merging the vector or array elements that are associated with the index values that the indeterminate index can have, and returning the merged value as the result of the read operation.

Under conventional HDL semantics, when a write operation is performed on an array whose index is indeterminate, the write operation does not write to any array element, i.e., the write operation does nothing. One embodiment of the present invention modifies the conventional HDL semantics by merging the value that is to be written with the value that is presently stored in the vector or array elements that are associated with the index values that the indeterminate index can have, and writing the merged value to those vector or array elements.

For example, suppose array "mem" stores 8 elements which can be accessed using a 3-bit index. If we write value "val" to index "3'b00X," then according to the conventional semantics, the value "val" will not be written, because the index has an indeterminate value. In contrast, an embodiment of the present invention will write to array elements mem[3'b000] and mem[3'b001]. Specifically, the embodiment will write the value "merge(val, mem[3'b000])" to array element mem[3'b000], and write the value "merge(val, mem[3'b001])" to array element mem[3'b001].

Ternary Operator

Under conventional HDL semantics, the behavior of the ternary operator "?" is usually more "optimistic" than its gate level implementations. One embodiment of the present invention modifies the behavior of the ternary operator so that it is more "pessimistic."

Specifically, for scalars "b" and "c," the ternary operation "a ? b: c" could be implemented at the gate level as "(a & b)|(~a & c)." Under conventional HDL semantics, the ternary operation may return the value of scalars "b" or "c" if they are equal to one another even if the control variable "a" is indeterminate. However, the gate level implementation will return an indeterminate value if the control variable "a" is indeterminate even if the values of "b" and "c" are equal to one another. Since the gate level implementation returns an indeterminate value in situations where the HDL interpretation does not, the gate level semantics can be more "pessimistic" than the HDL semantics.

In one embodiment, the system can receive a user-selectable merge-function. In response to determining that the control expression's value is indeterminate, the system can determine the output variable's value using the user-selectable merge-function, and store the output variable's value.

One embodiment of the present invention modifies the ternary operator's semantics so that, when the condition is indeterminate, the ternary operator will perform a merge of the alternatives, and return the merged value. Specifically, if variable "a" is indeterminate in the HDL statement "a ? b: c," the ternary operator will return the value "merge(b, c)."

Conversion from 4-State to 2-State

Another construct that can be problematic is the behavior of the conversion from 4-state to 2-state. If the converted 4-state value has some non 2-state values (e.g., Xs or Zs), then information will be lost during conversion. In one embodiment, the simulator produces a runtime warning when such a conversion occurs. Alternatively, the simulation can issue a runtime error and stop the simulation. The behavior of the simulation can be selected by the user.

Process of Modifying Semantics for HDL Constructs

Note that the portions of HDL code that are executed based on a control expression can be much more complicated than simple assignments, which can lead to very complex behavior. One embodiment of the present invention limits the amount of complexity by ensuring that any side effects that are performed by function calls are not submitted to the merge function. In other words, any functions or tasks in the code can be executed as if they had been called normally and their results are not merged. In another embodiment, the system can suppress the new semantics if there are calls to tasks or functions with side effects. For example, any user functions that are called via a programming interface may cause the system to suppress the new semantics. In yet another embodiment, the system can examine the function calls and determine if the function calls assign values to non-local variables which are accessed outside the function call (e.g., global variables or variables that are passed by reference to the function call). If so, the embodiment can apply the new semantics to these variables by assigning merged values to them.

The following sections describe processes for simulating HDL code according to the new semantics. Note that many modifications and variations will be readily apparent to practitioners skilled in the art. For example, instead of simulating the HDL code using an interpreter, the system can compile the HDL code to generate object code which when executed by a computer causes the computer to simulate the HDL code according to the new HDL semantics. Alternatively, the system can modify or rewrite the HDL code so that when the modified HDL code is compiled, it generates object code which when executed by a computer can cause the computer to simulate the HDL code according to the new HDL semantics.

In one embodiment, the terms "expression" and "statement" are not interchangeable because they relate to different programming language constructs. Specifically, an HDL expression and an HDL statement can be associated with different non-terminal symbols in the HDL's grammar. In one embodiment, a statement can include an expression, but an expression cannot include a statement.

Figure 5:
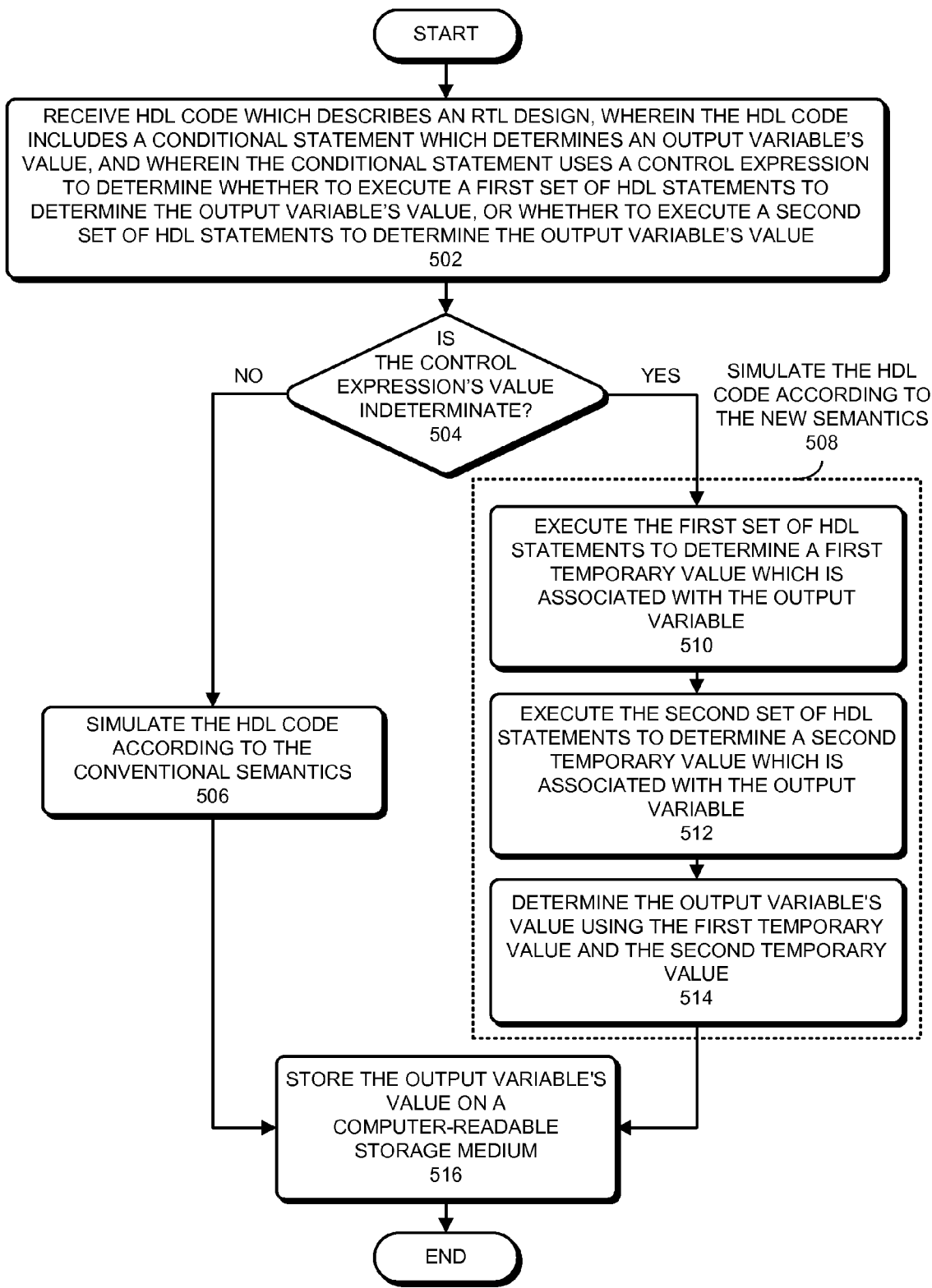
FIG. 5 presents a flowchart that illustrates a process for simulating conditional statements in accordance with an embodiment of the present invention.

FIG. 5 presents a flowchart that illustrates a process for simulating conditional statements in accordance with an embodiment of the present invention.

The process can begin by receiving HDL code which describes an RTL design, wherein the HDL code includes a conditional statement which determines an output variable's value, and wherein the conditional statement uses a control expression to determine whether to execute a first set of HDL statements to determine the output variable's value, or whether to execute a second set of HDL statements to determine the output variable's value (step 502). The control expression can be an HDL expression that is consistent with the HDL's syntax. A set of HDL statements can include zero or more HDL statements.

For example, the HDL code can include an "if" statement which uses a control expression, e.g., the condition, to determine whether to execute a first set of HDL statements or to execute a second set of HDL statements. Alternatively, the HDL code can include a "case" statement which uses a control expression to determine which set of HDL statements to execute. Additionally, the HDL code can include a process that uses a control expression, e.g., the sensitivity list, to determine whether to execute a set of HDL statements or not.

In one embodiment, a ternary operator, e.g., the "?" operator, is not a conditional statement. A ternary operator uses the value of a conditional expression to determine whether to evaluate a first expression or whether to evaluate a second expression. On the other hand, a conditional statement uses the value of a conditional expression to determine whether to evaluate a first set of statements or whether to evaluate a second set of statements. If the embodiment treats an expression and a statement as different HDL constructs, then a ternary operator is not a conditional statement.

As mentioned above, a set of HDL statements can be "null," i.e., it may not contain any HDL statements. For example, consider an "if" statement which does not have an "else" block. This "if" statement has only one set of HDL statements which is executed if the condition is true; the set of HDL statements that corresponds to the "else" block is "null." Similarly, a process typically executes a set of HDL statements based on a sensitivity list. If the conditions described in the sensitivity list are not true, the process usually does not execute any code.

Next, the system can simulate the HDL code. Specifically, during the simulation, the system can check if the control expression's value is indeterminate (step 504).

If the control expression's value is known, i.e., if none of the bits in the control expression's value is an indeterminate bit, the system can simulate the HDL code according to the conventional semantics (step 506). Specifically, the system can use the control expression's value to determine whether to execute the first set of HDL statements or the second set of HDL statements, and in doing so, determine the output variable's value.

On the other hand, if the control expression's value is indeterminate, the system can simulate the HDL code according to the new semantics (step 508).

Specifically, the system can execute the first set of HDL statements to determine a first temporary value which is associated with the output variable (step 510).

Next, the system can execute the second set of HDL statements to determine a second temporary value which is associated with the output variable (step 512).

The system can then determine the output variable's value using the first temporary value and the second temporary value (step 514). If a set of HDL statements is null, executing the set of HDL statements can be equivalent to doing nothing, i.e., performing a NOP. For example, if the second set of HDL statements is empty, the system will simply skip to the next step, i.e., the system will determine the output value using the first temporary value and the existing value of the output variable.

In one embodiment, the system can use a "merge" function to determine the output variable's value by merging the first temporary-value and the second temporary-value. The merge function can set the merged value to the first temporary-value or the second temporary value. Alternatively, if the first temporary-value is not equal to the second temporary-value, the merge function can set the merged value to a special value, e.g., "X," which indicates that the output variable's value is indeterminate. For example, if the first temporary-value is "2'b10" and the second temporary-value is "2'b11," one merge function can return "2'b10," another merge function can return "2'b11," and yet another merge function can return "X."

In yet another embodiment, the system can merge the first temporary-value or the second temporary value by performing a bit-by-bit merge of the two values. Specifically, the system can set a bit in the output variable to "X" if the respective bits in the first temporary-value and the second temporary value are not equal to one another. Otherwise, if the bits are equal to one another, the system can set the respective bit in the output variable to be equal to this bit value. For example, if the first temporary-value is "2'b10" and the second temporary-value is "2'b11," the merge function can return "2'b1X."

In one embodiment, the system determines the output variable's value by using a user-selectable merge-function to merge the first temporary-value and the second temporary-value. The user-selectable merge-function can be chosen so that the behavior of the RTL design is substantially the same as the behavior of the synthesized gate level design. In one embodiment, the system can change the user-selectable merge-function function during runtime. For example, the simulator or the simulation executable can expose a user interface which can be used to pause the simulation. Next, the user can select a different user-selectable merge-function function. Next, the user can continue simulation using the new user-selectable merge-function function. Alternatively, the user can specify which user-selectable merge-function function to use during compilation.

Continuing with the process shown in FIG. 5, the system can then store the output variable's value on a computer-readable storage medium (step 516). For example, the system can store the output variable's value at a memory location that is associated with the output variable.

Many modifications and variations of the process shown in FIG. 5 are possible. For example, in one embodiment, the system can receive HDL code which includes an HDL construct which executes different portions of the HDL code based on a control expression's value. Next, in response to determining that the control expression's value is indeterminate, the system can assign a special value to the output variable which indicates that the output variable's value is indeterminate. The embodiment may assign the special value to the output variable even if the different portions of HDL code would have assigned the same value to the output variable. Note that, in this embodiment, the system may not use a merge function or rename the variables since the system can assign the special value to the output variable as soon as it determines that the control expression's value is indeterminate. In other words, the system can omit the merge function since the results are not a function of the renamed variables.

In another embodiment, the system may receive HDL code which assigns an input variable's value to an output variable if a clock variable's value changes from a first clock-value to a second clock-value. However, if the clock variable's value does not change from the first clock-value to the second clock-value, the HDL code may not change the output variable's value. Next, in response to determining that the clock variable's value changed from the first clock-value to an indeterminate value or from an indeterminate value to the second clock-value, the system may determine a merged value using the input variable's value and the output variable's current value. The system may then assign the merged value to the output variable.

Figure 6:
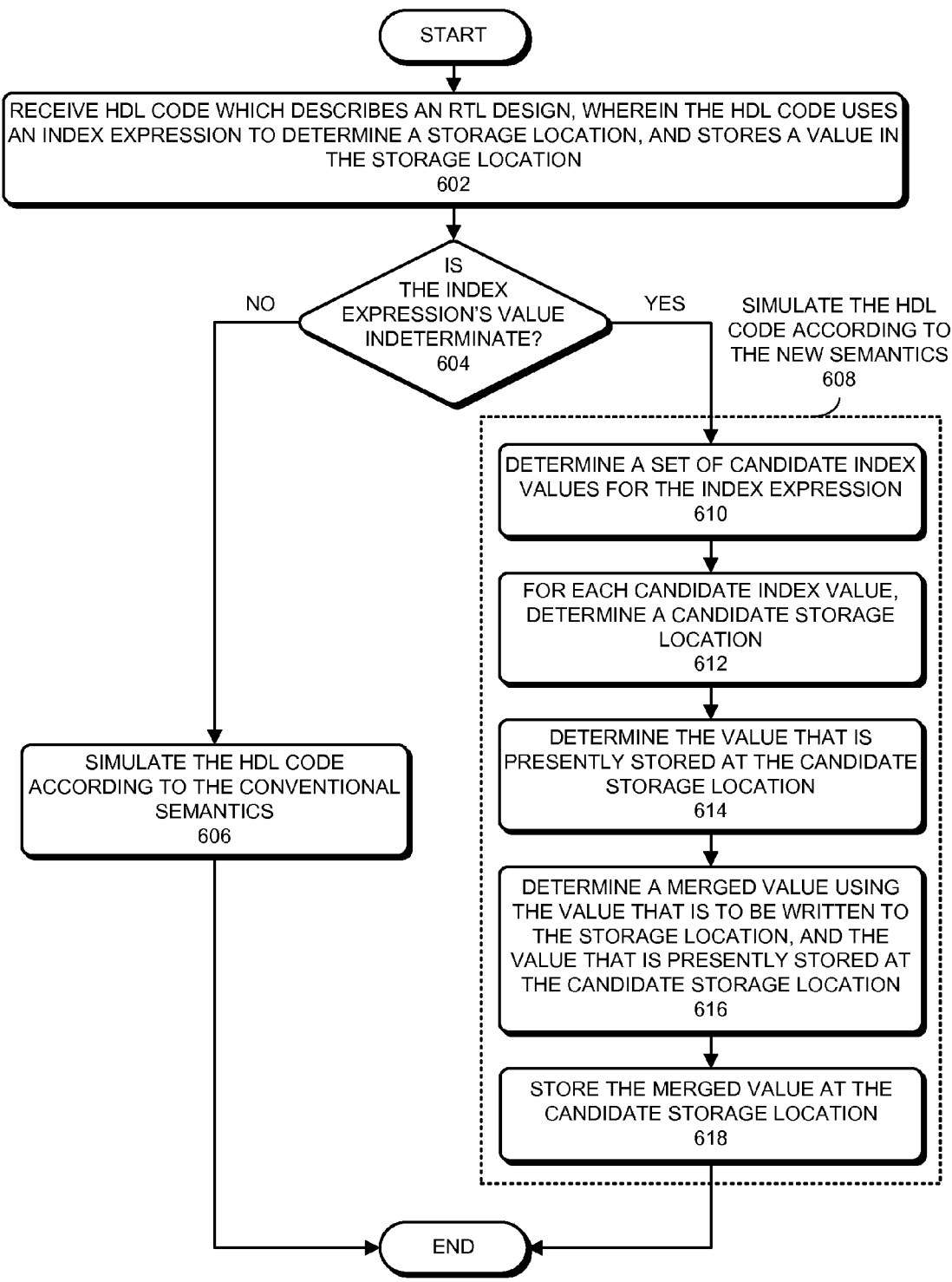
FIG. 6 presents a flowchart that illustrates a process for simulating a construct that uses a variable index expression in accordance with an embodiment of the present invention.

FIG. 6 presents a flowchart that illustrates a process for simulating a construct that uses a variable index expression in accordance with an embodiment of the present invention.

The process can begin by receiving HDL code which describes an RTL design, wherein the HDL code uses an index expression to determine a storage location, and then stores a value in the storage location (step 602). For example, the HDL code can include a statement that writes a value to an array element which is determined using an index expression. An index expression can be an HDL expression that is consistent with the HDL's syntax. A storage location can be a location on a computer-readable storage medium that is used for storing values. For example, a storage location can be a memory location that is used for storing a vector or array element.

Next, the system can simulate the HDL code. Specifically, during the simulation, the system can check if the index expression's value is indeterminate (step 604).

If the index expression's value is known, the system can simulate the HDL code according to the conventional semantics (step 606). Specifically, the system can use the index expression's value to determine a storage location, and write the value to the storage location.

On the other hand, if the control expression's value is indeterminate, the system can simulate the HDL code according to the new semantics (step 608).

Specifically, the system can determine a set of candidate index values for the index expression's value (step 610). For example, if the index expression's value is "2'b1X," the set of candidate index-values can include "2'b10" and "2'b11."

For each candidate index value, the system can determine a candidate storage location (step 612). For example, the system can select a candidate index value and determine a candidate storage location using the selected candidate index value.

Next, the system can determine the value that is presently stored at the candidate storage location (step 614).

The system can then determine a merged value using the value that is to be written to the storage location, and the value that is presently stored at the candidate storage location (step 616). As explained above, the system can use different merge functions to determine the merged value.

Next, the system can store the merged value at the candidate storage location (step 618).

Figure 7:
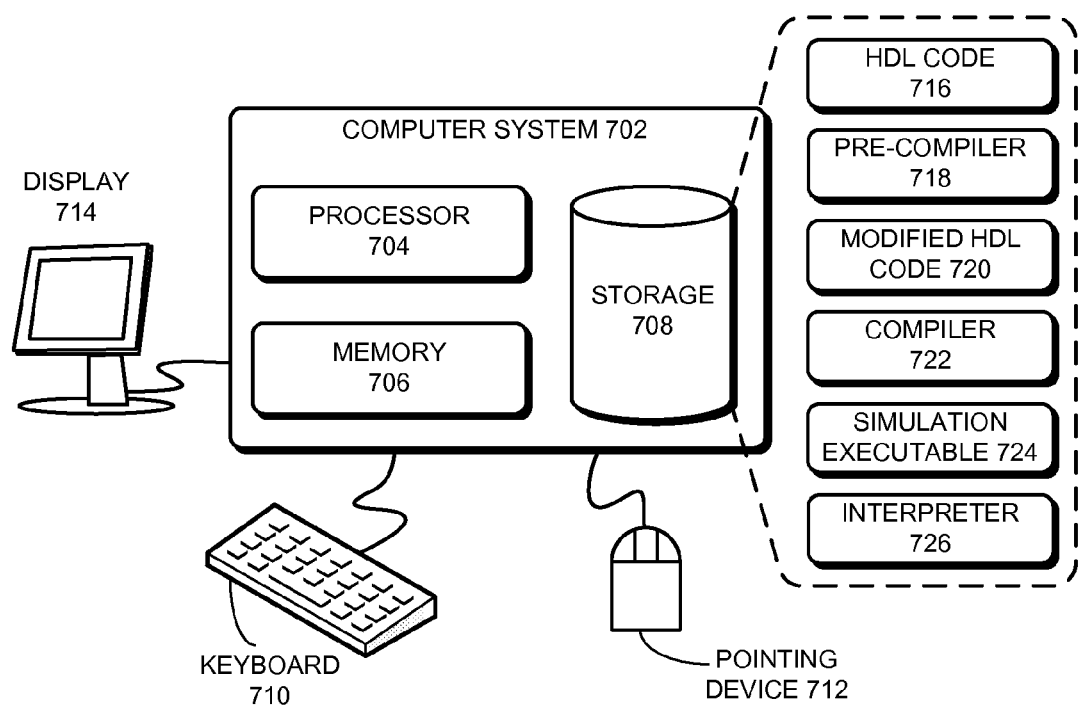
FIG. 7 illustrates a computer system in accordance with an embodiment of the present invention.

FIG. 7 illustrates a computer system in accordance with an embodiment of the present invention.

A computer system can be used to simulate, compile, or modify HDL code. Computer system 702 comprises processor 704, memory 706, and storage device 708. Computer system 702 can be coupled to display 714, keyboard 710, and pointing device 712. Storage device 708 can store HDL code 716, pre-compiler 718, modified HDL code 720, compiler 722, simulation executable 724, and interpreter 726.

A user may want to simulate the RTL design described by HDL code 716 according to the new HDL semantics. A user can use pre-compiler 718 to rewrite or modify HDL code 716 to generate modified HDL code 720. Modified HDL code 720 can then be compiled using compiler 722 to generate simulation executable 724. When simulation executable is executed by computer system 702, it can cause computer system 702 to simulate the behavior of the RTL design according to the new semantics. Alternatively, a user can provide modified HDL code 720 to interpreter 726 to simulate the RTL design according to the new semantics.

Compiler 722 and interpreter 726 can use conventional HDL semantics if the new HDL semantics are completely implemented by pre-compiler 718. Alternatively, if the new HDL semantics are implemented by compiler 722 or interpreter 726, we may not need pre-compiler 718 or the pre-compilation step. In yet another variation, some aspects of the new HDL semantics can be implemented by pre-compiler 718, whereas other aspects can be implemented by compiler 722 or interpreter 726.

A compiler can insert markers in the object code to enable a debugger to determine the portion of HDL code that corresponds to a portion of object code. If the compiler implements the new semantics, it may have to change the way it inserts markers in the object code so that the debugger can continue to correlate the HDL code with the object code. The debugger may also need to be modified so that it interprets the markers properly.

CONCLUSION

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art. Additionally, the above disclosure is not intended to limit the present invention. The scope of the present invention is defined by the appended claims.

What is claimed is:

1. A method for generating a simulation executable, the method comprising:
   receiving HDL code which describes an RTL (register transfer level) design, wherein the HDL code includes a conditional statement which executes a first branch or a second branch based on a value of a control expression; and
   generating, by using one or more processors, the simulation executable, comprising:
   instructions for evaluating the control expression; and
   instructions for, in response to determining that the value of the control expression is indeterminate,
   executing the first branch to obtain a first temporary result,
   executing the second branch to obtain a second temporary result, and determining a final result by merging the first temporary result and the second temporary result based on a merge function.

2. The method of claim 1, wherein the merge function is user selectable.

3. The method of claim 1, wherein the merge function outputs the first temporary result as the final result.

4. The method of claim 1, wherein the merge function outputs the second temporary result as the final result.

5. The method of claim 1, wherein the merge function performs a bit-by-bit merge of the first temporary result and the second temporary result.

6. The method of claim 1, wherein the conditional statement is an "if" statement.

7. The method of claim 1, wherein the conditional statement is a "case" statement.

8. The method of claim 1, wherein the conditional statement includes a ternary operator.

9. A non-transitory computer-readable storage medium storing an HDL (hardware description language) compiler that when executed by a computer causes the computer to perform a method for generating a simulation executable, the method comprising:
 receiving HDL code which describes an RTL (register transfer level) design, wherein the HDL code includes a conditional statement which executes a first branch or a second branch based on a value of a control expression; and
 generating the simulation executable, comprising:
  instructions for evaluating the control expression; and
  instructions for, in response to determining that the value of the control expression is indeterminate,
   executing the first branch to obtain a first temporary result,
   executing the second branch to obtain a second temporary result, and
   determining a final result by merging the first temporary result and the second temporary result based on a merge function.

10. The non-transitory computer-readable storage medium of claim 9, wherein the merge function is user selectable.

11. The non-transitory computer-readable storage medium of claim 9, wherein the merge function outputs the first temporary result as the final result.

12. The non-transitory computer-readable storage medium of claim 9, wherein the merge function outputs the second temporary result as the final result.

13. The non-transitory computer-readable storage medium of claim 9, wherein the merge function performs a bit-by-bit merge of the first temporary result and the second temporary result.

14. The non-transitory computer-readable storage medium of claim 9, wherein the conditional statement is an "if" statement.

15. The non-transitory computer-readable storage medium of claim 9, wherein the conditional statement is a "case" statement.

16. The non-transitory computer-readable storage medium of claim 9, wherein the conditional statement includes a ternary operator.

17. A non-transitory computer-readable storage medium storing instructions that when executed by a computer causes the computer to interpret HDL (hardware description language) code, the instructions comprising:
 instructions for receiving the HDL code which describes an RTL (register transfer level) design, wherein the HDL code includes a conditional statement which executes a first branch or a second branch based on a value of a control expression; and
 instructions for interpreting the HDL code by:
  evaluating the control expression; and
  in response to determining that the value of the control expression is indeterminate,
   executing the first branch to obtain a first temporary result,
   executing the second branch to obtain a second temporary result, and
   determining a final result by merging the first temporary result and the second temporary result based on a merge function.

18. The non-transitory computer-readable storage medium of claim 17, wherein the merge function is user selectable.

19. The non-transitory computer-readable storage medium of claim 17, wherein the merge function outputs the first temporary result as the final result.

20. The non-transitory computer-readable storage medium of claim 17, wherein the merge function outputs the second temporary result as the final result.

21. The non-transitory computer-readable storage medium of claim 17, wherein the merge function performs a bit-by-bit merge of the first temporary result and the second temporary result.

22. The non-transitory computer-readable storage medium of claim 17, wherein the conditional statement is an "if" statement.

23. The non-transitory computer-readable storage medium of claim 17, wherein the conditional statement is a "case" statement.

24. The non-transitory computer-readable storage medium of claim 17, wherein the conditional statement includes a ternary operator.

* * * * *